(12) United States Patent
Kan et al.

(10) Patent No.: US 7,281,231 B2
(45) Date of Patent: Oct. 9, 2007

(54) INTEGRATED CIRCUIT STRUCTURE AND A DESIGN METHOD THEREOF

(75) Inventors: Tsang-Chi Kan, Taipei (TW); Wen-Ling Chen, Taipei (TW); Min-Chih Liu, Taipei (TW)

(73) Assignee: ALi Corporation, Taipei (TW)

( * ) Notice: Subject to any disclaimer, the term of this patent is extended or adjusted under 35 U.S.C. 154(b) by 69 days.

(21) Appl. No.: 10/760,309

(22) Filed: Jan. 21, 2004

(65) Prior Publication Data

US 2005/0028126 A1    Feb. 3, 2005

(30) Foreign Application Priority Data

Jul. 22, 2003   (TW) .............................. 92119907 A

(51) Int. Cl.
*G06F 17/50*   (2006.01)

(52) U.S. Cl. ............................... 716/12; 716/1; 716/10

(58) Field of Classification Search ............... 716/1–21
See application file for complete search history.

(56) References Cited

U.S. PATENT DOCUMENTS

| 5,432,999 | A * | 7/1995 | Capps et al. ............... 438/109 |
| 6,291,331 | B1 * | 9/2001 | Wang et al. ............... 438/618 |
| 6,362,638 | B1 * | 3/2002 | Ashton et al. ............... 324/755 |
| 6,433,436 | B1 * | 8/2002 | Feild et al. ............... 257/774 |
| 6,444,565 | B1 * | 9/2002 | Feild et al. ............... 438/622 |
| 6,448,641 | B2 * | 9/2002 | Ker et al. ............... 257/700 |
| 6,784,510 | B1 * | 8/2004 | Grynkewich et al. ....... 257/421 |
| 6,882,576 | B2 * | 4/2005 | Tomita ............... 365/188 |
| 2002/0074660 | A1 * | 6/2002 | Fukasawa ............... 257/758 |
| 2002/0157082 | A1 * | 10/2002 | Shau ............... 716/19 |
| 2003/0051218 | A1 * | 3/2003 | Kumagai ............... 716/8 |
| 2003/0067075 | A1 * | 4/2003 | Fukasawa ............... 257/758 |
| 2004/0120175 | A1 * | 6/2004 | Schrom et al. ............... 365/51 |

* cited by examiner

*Primary Examiner*—Paul Dinh
*Assistant Examiner*—Nghia M. Doan
(74) *Attorney, Agent, or Firm*—Troxell Law Office, PLLC

(57) ABSTRACT

The present invention discloses an integrated circuit structure and a design method thereof, in which a circuit passageway is arranged at each circuit element terminal in circuit design stage. The arranged circuit passageway does not only increase layout flexibility in circuit simulation stage but also simplify layout difficulty when the circuit layout needs to be modified after taping out stage. Also, the circuit passageway can minimize modified metal layers, i.e. the number of modified masks is minimized. Because the expense of fab is based on the utilized layers and number of masks instead of designs of masks, the present invention will not increase the expense in taping out stage and can save the cost of research and development when modifications are required.

6 Claims, 5 Drawing Sheets

INTEGRATED CIRCUIT STRUCTURE AND A DESIGN METHOD THEREOF

BACKGROUND OF THE INVENTION (a) Field of the Invention

The present invention relates to an integrated circuit structure and a layout design method thereof, and more particularly to an integrated circuit structure and a layout design method thereof which prearrange circuit passageways for reducing extent of modifying at future stage.

(b) Description of the Prior Arts

Along with the development of technologies, people further require features of communication products such as mobile phone or mobile products such as PDA to be lighter, thinner, shorter, and smaller so that applications of those integrated circuits (IC) satisfy with the above requirements are becoming broader and broader. Integrated circuit utilizes a way for three-dimensionizing a circuit to reduce the area used and can be frequently found in various applications.

Please refer to FIG. 1, which is a design flow chart of an integrated circuit. Just like software design, even if source coding is finished and is compiled by a compiler to be a run-able state, few programs can achieve designer's objects at its first running. First, a designer should design a circuit according to requirements and connects related elements layout to each other. Further, the circuit is simulated by aids of computers to find error connections or improper designs to be corrected. After affirming that no problem is existing and design objects are matched, the step of taping out is proceeded, wherein "tape out" means to deliver designed circuit to fab for production. Then, taking back the taped out product to perform practical test for verifying circuit characteristics of the chip. Afterwards, original circuit design is examined according to whether the test result matches to design objects. If there was mismatch or defect then backing to design steps for modifying. If design objects were matched then mass production can be performed according to the above taped out circuit.

However, the expense of modification for taped out product is very amazing. Please refer to FIG. 2, which is a schematic figure of conventional integrated circuit modification. The integrated circuit comprises a substrate 1, which forms many circuit elements such as FET and CMOS by semiconductor processes, pluralities of metal layers used as connection layout for circuit elements, and some isolation layers: the first isolation layer 31, the second isolation layer 32, the third isolation layer 33 and the fourth isolation layer 34, which are disposed among metal layers and providing electrical isolation among metal layers; that is to say one metal layer is not conducted with another metal layer. Usually, one terminal of the above-mentioned circuit element is pulled to the first metal layer 21 for usage of circuit layout. Since consumers require more and more functions, designed circuit becomes larger and larger and frequently contains millions of circuit elements. Thus, the circuit elements are not probably accomplished one by one manually. For accelerating the design flow, usually a method of "modulization" is utilized, i.e. elements with frequently-used functions are assembled previously to a fixed form which can be used directly at design stage without designing each element from the start. Such assembly is called a standard cell. Usually, these standard cells are gathered to form a so-called standard cell library utilized by designers. Statistically, in IC design, more than 90% of an intellectual property element is expressed by frequently-used standard cells. Thus, standard cells are very common in an intellectual property element library (IP library). Particularly, IP means originally "intellectual property," however in semiconductor industry, IP is extended to a designed and verified integrated circuit design with specific functions, which is also called silicon intellectual property. Besides, since elements of an integrated circuit are very numerous and their connection lines are further complicated, the elements cannot be connected one by one manually and usually are done in accordance with layout algorithm by a design software. Thus, these complicated connection lines must be passed over when modifying the circuit design. Since adding new connection lines is more difficult than cutting original connection lines, the following descriptions are focused on adding new connection lines.

Please refer to FIG. 2 again, the integrated circuit standard cell of this embodiment includes four metal layers: the first metal layer 21, the second metal layer 22, the third metal layer 23, and the fourth metal layer 24. Usually layout of a standard cell only utilizes the first metal layer 21, but X node 11 may be connected to Y node 12 based on requirements of circuit correction or design modifying. However, the first metal layer 21 and the second metal layer 22 has already been used by other connection lines 41 and 42 so that nodes 11 and 12 cannot be directly connected and should be connected by way of other metal layers. Because the third metal layer 23 is also used by connection line 43, the connection is achieved by finding paths upwardly and downwardly. Please note that, in the embodiment, connection between X node 11 and Y node 12 blocked by connection lines is depicted schematically. Actually, connection lines distributed in the first metal layer 21 and the second metal layer 22 are very complicated such that X node 11 and Y node 12 cannot be connected directly.

Thus, each metal layer may be used to achieve the connection between X node 11 and Y node 12. At circuit design stage, a connection line should starts from X node of the first metal layer 21, then passes the second metal layer 22 and the third metal layer 23, and pulls back to the second metal layer so as to connect with Y node of the first metal layer. However, at actual production stage, connection lines of an integrated circuit should be modified by changing masks. Besides, since metal layers are insulated with each other, an isolation layer must be punched through to form a so-called via. By such design, there are five masks, including the first metal layer 21, the via 51 between the first metal layer 21 and the second metal layer 22, the second metal layer 22, the via 52 between the second metal layer 22 and the third metal layer 23, and the third metal layer 23, must being changed. And, the expense of foundry is based on the number of changed masks. Usually, the expense of changing a mask is NT$ 500,000. For the case of the above embodiment, merely adding such a connection line should change five masks and pay NT$ 2,500,000! It is a very astonishing cost. Further, it takes time to re-design layout and re-produce connection line masks. Thus, a new method should be found to reduce the cost of research, development and time for increasing competitiveness.

SUMMARY OF THE INVENTION

The main object of the present invention is to provide an integrated circuit structure and a design method thereof, in which the modifications are minimized when the circuit layout needs to be modified.

The secondary object of the present invention is to provide an integrated circuit structure and a design method thereof, by which the cost and time of research can be reduced.

To reach the aforesaid objects, the present invention provides an integrated circuit (IC) structure utilized in a standard cell, comprising:

a substrate including pluralities of circuit elements; and m metal layers, which are disposed on said substrate and utilized as connection layout for circuit elements, wherein each metal layer further including an isolation layer for electrical isolation among metal layers;

said structure is characterized in that one terminal of at least one circuit element is arranged with a circuit passageway, said circuit passageway extends from said substrate through n metal layers such that any connection line in each metal layer can be connected with said terminal by said circuit passageway, wherein n is larger than 1 and n is less than m+1.

The present invention also provides an integrated circuit (IC) layout design method utilized for connection of elements in a standard cell, wherein said IC comprises a substrate, said substrate further including pluralities of circuit elements; and m metal layers disposed on said substrate, which are utilized as connection layout for circuit elements, wherein each metal layer further including an isolation layer for electrical isolation among metal layers; said IC layout design method comprising the following steps:

arranging a circuit passageway at one terminal of a circuit element, said circuit passageway extends from said substrate through at least two metal layers; and connecting a line, which is required to be electrically connected to said terminal, to said terminal by connecting said line to said circuit passageway.

DETAILED DESCRIPTION OF THE INVENTION

For your esteemed examiners to further recognize and understand the characteristics, objects, and functions of the invention, preferable embodiments cooperating with corresponding drawings are presented in detail thereinafter.

The spirit of the invention lies in prearranging a "circuit passageway" at each circuit element terminal in circuit simulation stage such that the same metal layer can be used to the best possibility when the design of circuit connections needs to be modified and thus the object of minimizing the number of modified masks can be achieved.

Figure 3:
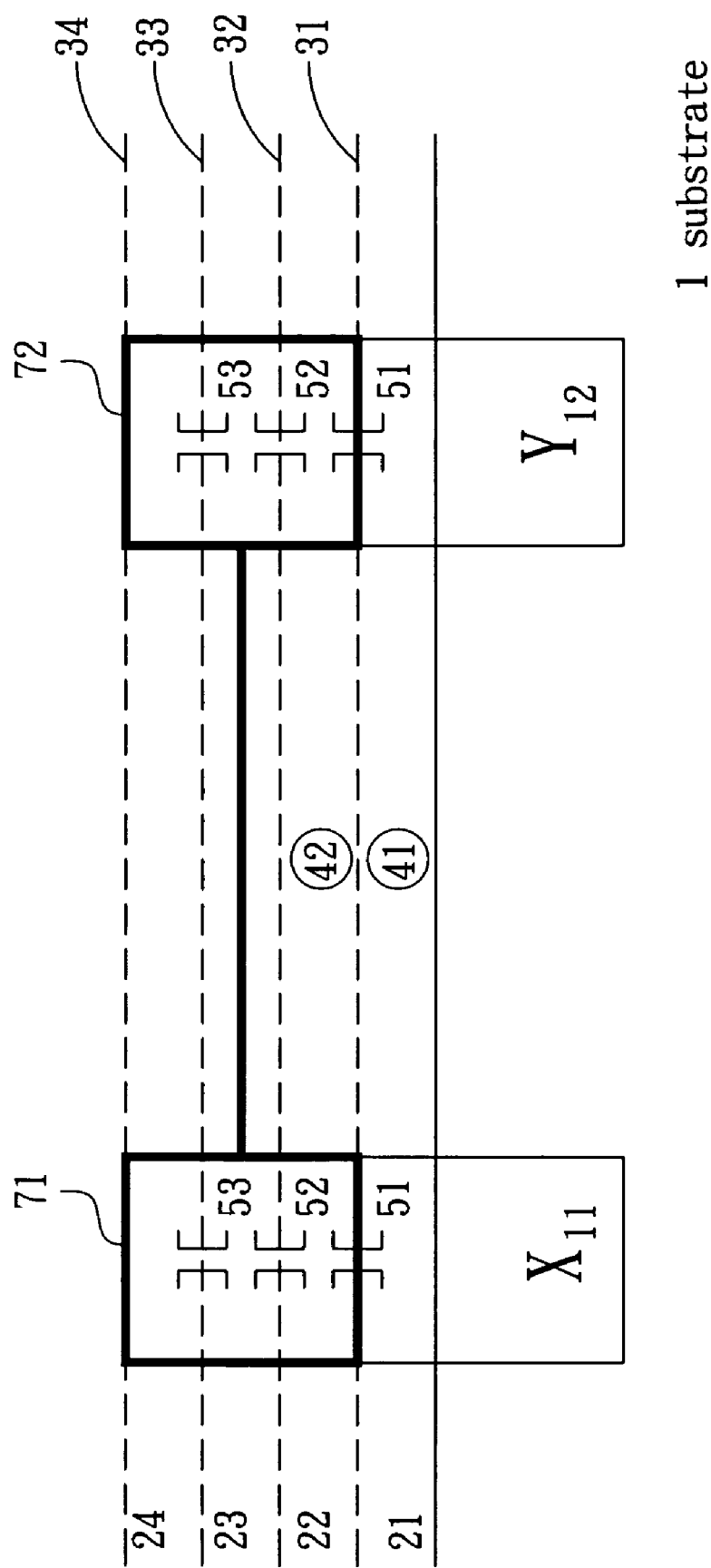
FIG. 3 is a schematic figure of integrated circuit modification of the invention.

Please refer to FIG. 3, which is a schematic figure of integrated circuit modification of the invention. The invention provides an integrated circuit (IC) structure, comprising:

a substrate 1, in which circuit elements, such as FET and CMOS formed by semiconductor processes, of an integrated circuit are placed, usually including pluralities of circuit elements;

m metal layers, which are disposed on said substrate and utilized as connection layout for circuit elements, each terminal of circuit elements usually juts into the first metal layer for conveniently connecting to other elements, wherein each metal layer further including an isolation layer for electrical isolation among metal layers;

the invention is characterized in arranging a circuit passageway at each terminal of circuit elements for connecting through different metal layers, wherein said circuit passageway extends from said substrate upwardly to n metal layers such that the object of connecting one of these n metal layers with terminal of a circuit element can be achieved by connecting it with said circuit passageway directly, wherein n is larger than 1 and less than m+1 (i.e. 1<n≦m). In one embodiment of the invention, the object of the invention can be achieved by connecting the circuit passageway with the first metal layer and the second metal layer. In another embodiment of the invention, the circuit passageway is connected with the first metal layer, the second metal layer and the third metal layer. Of course, the circuit passageway can be connected through all metal layers, i.e. n is equal to m.

Figure 1:
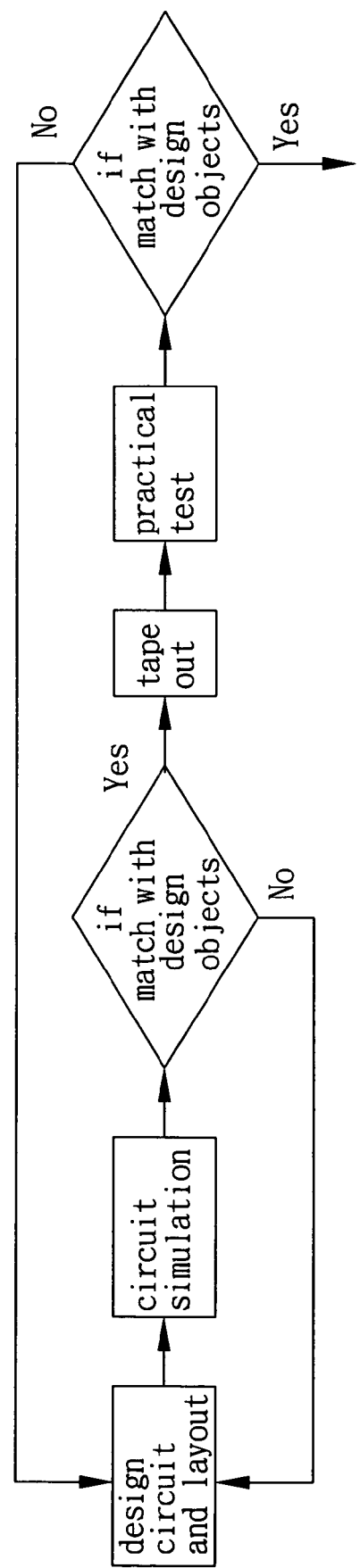
FIG. 1 is a design flow chart of an integrated circuit.
Figure 2:
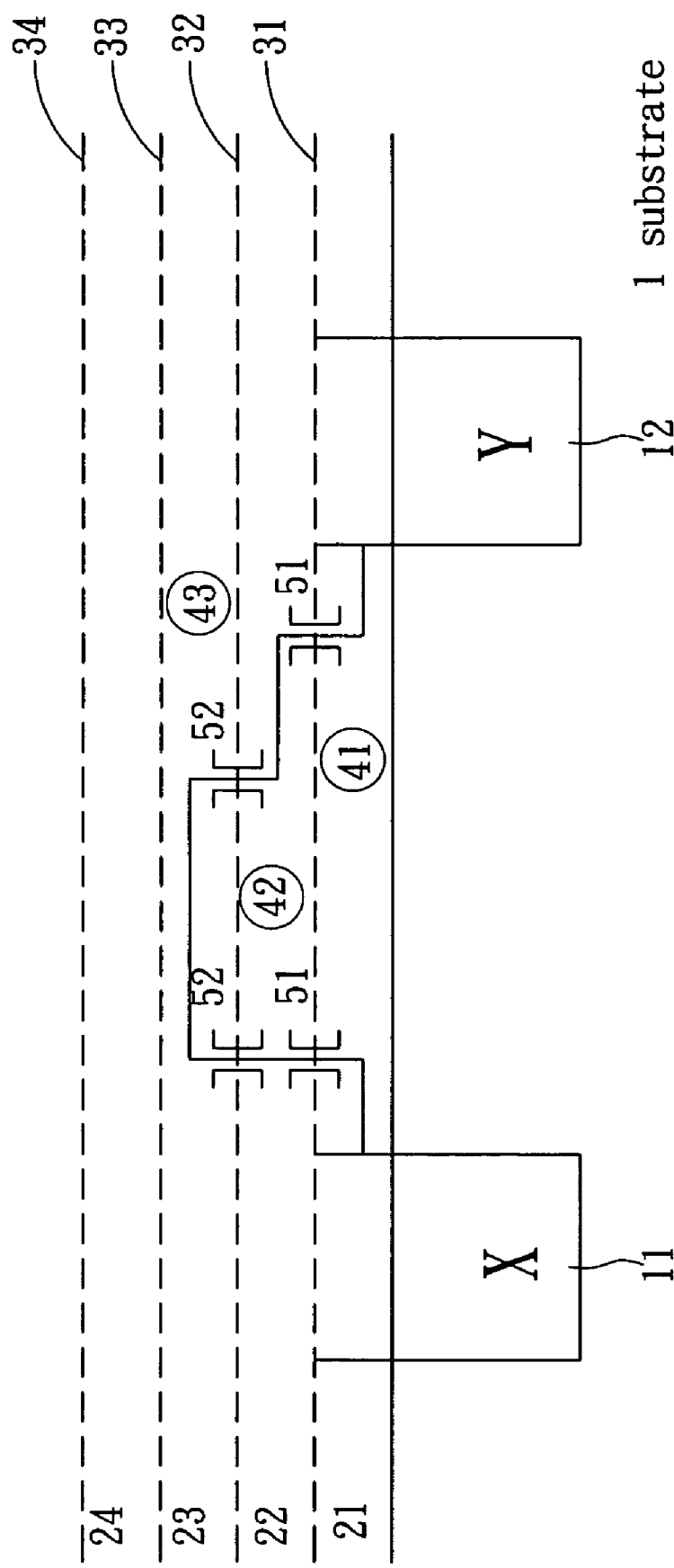
FIG. 2 is a schematic figure of conventional integrated circuit modification.

Since the circuit passageway must conduct through different metal layers, the circuit passageway includes pluralities of vias in isolation layers to achieve the object of connection. As shown in FIG. 3, the circuit passageway comprises the first metal layer 21, the second metal layer 22, the third metal layer 23, the fourth metal layer 24, and the via 51 connecting the first metal layer and the second metal layer, the via 52 connecting the second metal layer and the third metal layer, and the via 53 connecting the third metal layer and the fourth metal layer. The situation shown in FIG. 3 is that X node 11 and Y node 12 are required to be connected and the first metal layer 21 and the second metal layer 22 cannot provide a proper path. By the invention, the circuit passageway 71 of X node 11 and the circuit passageway 72 of Y node 12 can be connected directly through the third metal layer 23 or the fourth metal layer 24 and there is no need to pull a connection line from lower layer to higher layer then being pulled to lower layer as shown in FIG. 2. By utilizing the method of the invention, in addition to increasing flexibility when modifying layout design, the expense of changing masks is greatly reduced because only one mask (the third metal layer 23) needs to be changed. Please note that, in this embodiment, direct connection between X node 11 and Y node 12 is depicted schematically. Actually, connection in the third metal layer 23 may be creeping and winding.

Figure 4A:
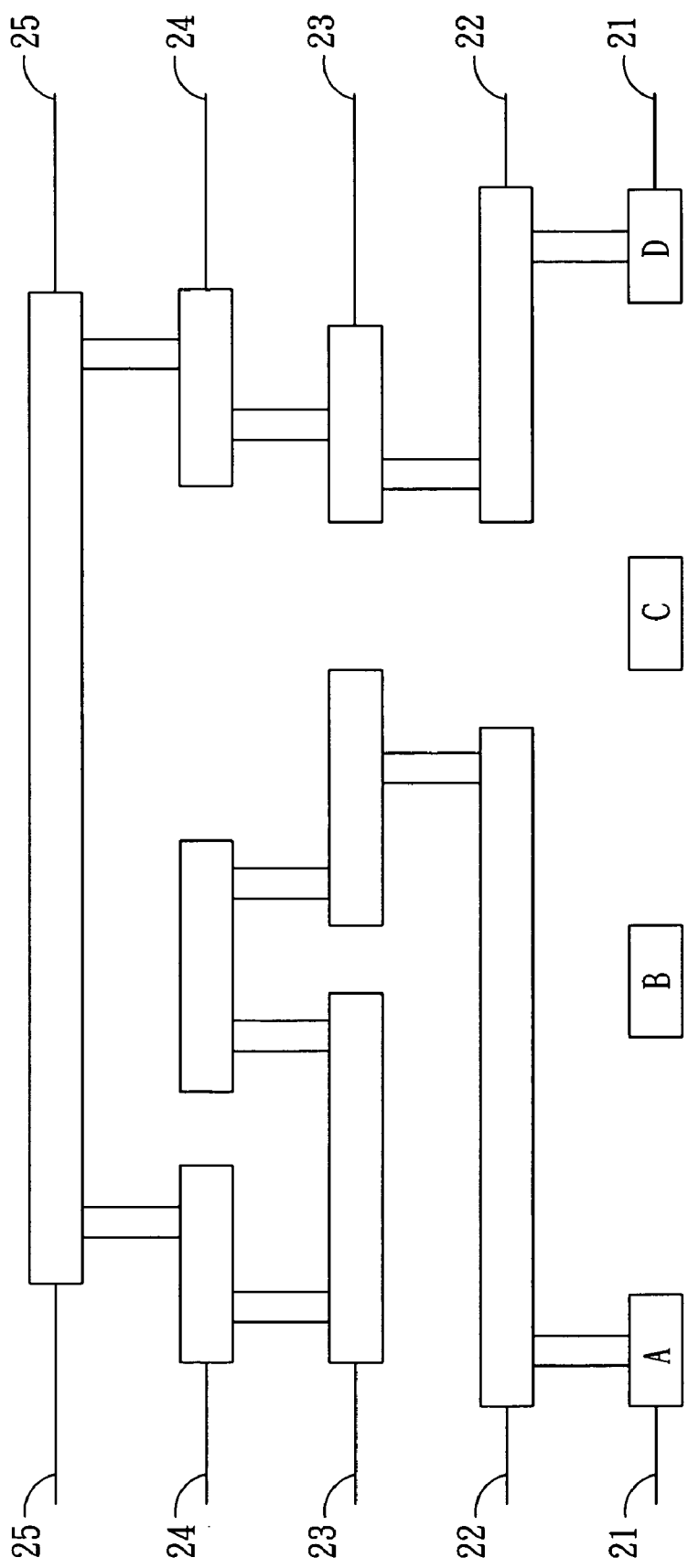
FIG. 4A is an embodiment of conventional line connection technology.
Figure 4B:
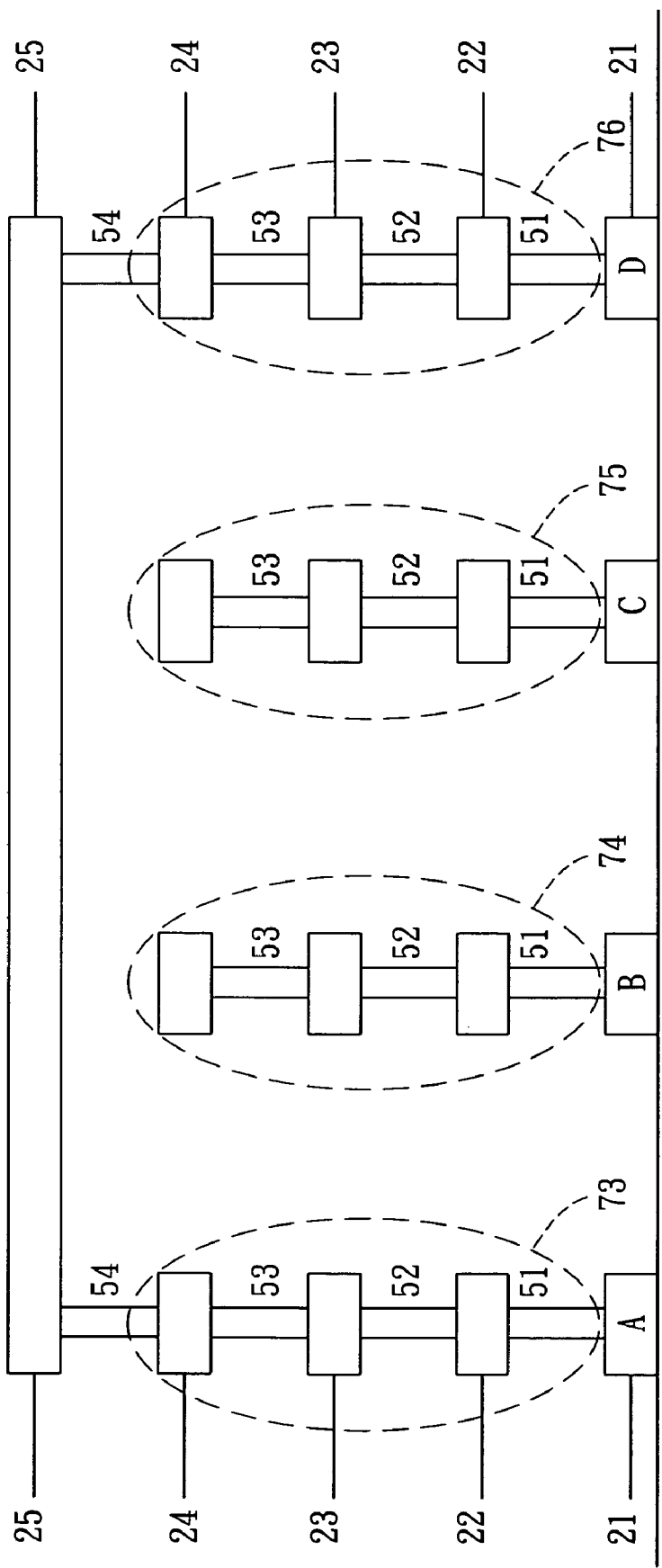
FIG. 4B is an embodiment of line connection technology of the invention.

Please refer to FIGS. 4A and 4B, which depict another embodiment of the invention and compare the invention with conventional line connection technology. The embodiment directs to an integrated circuit with five metal layers. As shown in FIG. 4A, there are four element terminals A, B, C and D in the embodiment. In order to connect A with D, by conventional technology, it probably needs to find paths upwardly and downwardly among metal layers such that poor readability of the connection line is caused and the difficulty of re-modifying is increased. However, the situation of the invention is different. Referring to FIG. 4B, please note that the circuit passageways 73, 74, 75 and 76 of the embodiment are only built to the fourth metal layer 24 and connection vias can be easily found in the fifth metal layer 25, thus in the embodiment, the object of connection is achieved only by connecting the vias to the fourth metal layer 24 and utilizing the circuit passageways instead of finding paths upwardly and downwardly among metal layers. Obviously, by the invention, the rate of modification is reduced. In a further embodiment of the invention, even one metal layer is reserved exclusively for modification so that in addition to obtaining a balance between modifying easily and minimizing modified masks, lower layers which need not be modified can be produced in advance to shorten production time.

To sum up, a circuit passageway is arranged in the invention at each circuit element terminal in circuit design stage. The arranged circuit passageway does not only increase layout flexibility in circuit simulation stage but also simplify layout difficulty when the circuit layout needs to be modified after taping out stage. Also, the circuit passageway can minimize modified metal layers, i.e. the number of modified masks is minimized. Because the expense of fab is based on the utilized layers and number of masks instead of designs of masks, the present invention will not increase the expense in taping out stage and can save the cost of research and development when modifications are required.

While the present invention has been shown and described with reference to two preferred embodiments thereof, and in terms of the illustrative drawings, it should be not considered as limited thereby. Those skilled in the art should appreciate that they can readily use the disclosed conception and specific embodiments as a basis for designing or modifying other structures for carrying out the same purpose of the present invention, and that various possible changes, substitutions and alterations can be made herein without departing from the spirit and scope of the invention as defined by the appended claims.

What is claimed is:

1. An integrated circuit (IC) layout design method utilized for connection of elements in a standard cell, wherein said IC comprises a substrate, said substrate further including pluralities of circuit elements; and m metal layers disposed on said substrate, which are utilized as a connection layout for circuit elements, wherein each metal layer further including an isolation layer for electrical isolation among said metal layers; said IC layout design method comprising the following steps:

arranging a pluralities of circuit passageways at one terminal of a circuit element, said pluralities of circuit passageways extending from said substrate through at least two of said metal layers;

connecting pluralities of lines which are required to be electrically connected to said terminal, to said terminal by connecting said lines to said circuit passageways;

forming an upper metal layer overlying the pluralities of circuit passageways and located adjacent to a top metal layer of the m metal layers, said upper metal layer being connected to a predetermined number of top metal layer circuit passageways, the predetermined number of top metal layer circuit passageways being less than all of a plurality of top metal layer circuit passageways of the pluralities of circuit passageways located through the top metal layer of the m metal layers; and modifying said circuit element by connecting said upper metal layer to a different set of the plurality of top metal layer circuit passageways located in the top metal layer of the m metal layers, the different set of top metal layer circuit passageways being less than all of the plurality of top metal layer circuit passageways of the pluralities of circuit passageways located through the top metal layer of the m metal layers.

2. The IC layout design method of claim 1, wherein at least one of said pluralities of circuit passageways connects through two metal layers.

3. The IC layout design method of claim 1, wherein at least one of said pluralities of circuit passageways connects through three metal layers.

4. The IC layout design method of claim 1, wherein said standard cell is connected to an intellectual property element.

5. The IC layout design method of claim 1, wherein said standard cell is connected to an intellectual property element library.

6. The IC layout design method of claim 1, further comprising reserving said upper metal layer exclusively for modification during a subsequent reworking of said circuit element.

* * * * *